United States Patent
Kakubari

(10) Patent No.: US 9,812,437 B2
(45) Date of Patent: Nov. 7, 2017

(54) SEMICONDUCTOR INTEGRATED CIRCUIT DEVICE, AND ELECTRONIC APPLIANCE USING THE SAME

(71) Applicant: SEIKO EPSON CORPORATION, Tokyo (JP)

(72) Inventor: Hideyuki Kakubari, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 329 days.

(21) Appl. No.: 14/631,079

(22) Filed: Feb. 25, 2015

(65) Prior Publication Data

US 2015/0243646 A1    Aug. 27, 2015

(30) Foreign Application Priority Data

Feb. 26, 2014 (JP) ................................. 2014-035050
Feb. 24, 2015 (JP) ................................. 2015-033787

(51) Int. Cl.

| H02H 9/04 | (2006.01) |
|---|---|
| H01L 27/02 | (2006.01) |
| H01L 29/74 | (2006.01) |
| H01L 27/092 | (2006.01) |

(52) U.S. Cl.
CPC ...... H01L 27/0255 (2013.01); H01L 27/0292 (2013.01); H01L 29/7412 (2013.01); *H01L 27/092* (2013.01)

(58) Field of Classification Search
CPC ........... H02H 9/04; H02H 9/041; H02H 9/046
USPC .......................................................... 361/56
See application file for complete search history.

(56) References Cited

U.S. PATENT DOCUMENTS

| 5,953,191 | A |   | 9/1999  | Narita |                     |
|-----------|---|---|---------|--------|---------------------|
| 6,075,686 | A | * | 6/2000  | Ker    | ...... H01L 27/0251 |
|           |   |   |         |        | 361/56              |
| 6,144,542 | A | * | 11/2000 | Ker    | ...... H01L 27/0292 |
|           |   |   |         |        | 361/111             |
| 7,098,511 | B2| * | 8/2006  | Ker    | ...... H01L 27/0292 |
|           |   |   |         |        | 257/360             |
| 7,411,767 | B2| * | 8/2008  | Huang  | ...... H01L 27/0292 |
|           |   |   |         |        | 361/56              |

(Continued)

FOREIGN PATENT DOCUMENTS

| JP | H10-214940 A | 8/1998 |
|----|--------------|--------|
| JP | 2009-164829 A | 7/2009 |

(Continued)

*Primary Examiner* — Dharti Patel
(74) *Attorney, Agent, or Firm* — Oliff PLC

(57) ABSTRACT

Provided is a semiconductor integrated circuit device including: an output buffer circuit having a P channel transistor connected between a first power supply terminal and a signal terminal; a potential control circuit that supplies potential from the first power supply terminal or the signal terminal to a back gate of the P channel transistor according to the potential of the signal terminal; a first protection diode having an anode connected to the signal terminal; a common discharge line connected to a cathode of the first protection diode; an electrostatic discharge protection circuit connected between the common discharge line and a second power supply terminal; and a second protection diode having an anode connected to the second power supply terminal and a cathode connected to the signal terminal.

6 Claims, 2 Drawing Sheets

(56) References Cited

U.S. PATENT DOCUMENTS

| | | | |
|---|---|---|---|
| 8,194,373 B2* | 6/2012 | Padden | H01L 27/0251 361/118 |
| 8,569,835 B2 | 10/2013 | Yasumori et al. | |
| 2003/0235019 A1* | 12/2003 | Ker | H01L 23/50 361/56 |
| 2011/0198678 A1* | 8/2011 | Ker | H02H 9/046 257/296 |

FOREIGN PATENT DOCUMENTS

| | | |
|---|---|---|
| JP | 2010-080472 A | 4/2010 |
| JP | 2011-096889 A | 5/2011 |
| JP | 2012-142668 A | 7/2012 |
| JP | 5-082841 B2 | 11/2012 |

\* cited by examiner

SEMICONDUCTOR INTEGRATED CIRCUIT DEVICE, AND ELECTRONIC APPLIANCE USING THE SAME

BACKGROUND

This application claims priority to JP 2014-035050 filed Feb. 26, 2014 and JP2015-033787 filed Feb. 24, 2015, the entire disclosure of which is incorporated herein by reference.

1. Technical Field

The present invention generally relates to a semiconductor integrated circuit device (IC), and more particularly to a semiconductor integrated circuit device internally provided with an output buffer circuit having a tolerant function. Furthermore, the invention relates to an electronic appliance or the like that uses such a semiconductor integrated circuit device.

2. Related Art

The tolerant function is a function that prevents current from flowing from a signal terminal to a power supply even if a voltage higher than the power supply voltage is applied to the signal terminal from the outside. For example, in a semiconductor integrated circuit device, if a signal having a voltage higher than the power supply voltage is input to an input/output terminal connected to an input circuit and an output buffer circuit, in the output buffer circuit in which the signal is applied to a drain of a P channel MOS field effect transistor, it is necessary to prevent current from flowing from the drain into the power supply via a back gate of the P channel MOS field effect transistor.

Also, in the semiconductor integrated circuit device, in order to prevent destruction of an internal circuit caused by electrostatic discharge (ESD), generally, a protective diode is connected in a direction opposite to the voltage direction between the signal terminal and a power supply terminal. However, in the output buffer circuit having a tolerant function, it is not possible to connect a protective diode between a high potential-side power supply terminal and the signal terminal to which a potential higher than the high potential-side power supply potential is applied.

Accordingly, an ordinary output buffer circuit having a tolerant function is configured such that, when positive charges are applied to the signal terminal due to electrostatic discharge, a protective diode connected between the signal terminal and a low potential-side power supply terminal breaks down to cause a flow of reverse current, as a result of which the positive charges are discharged to the low potential-side power supply terminal. This configuration requires, as the protective diode, a large diode that can withstand heat generation caused by a surge current generated at the time of breakdown, which causes an increase in the area of the semiconductor substrate and an increase in the cost of the semiconductor integrated circuit device.

As a related technique, Japanese Patent No. 5082841 (paragraphs 0014-0015, FIG. 1) discloses a semiconductor device including an electrostatic discharge (ESD) protection circuit that does not require special tuning, can reduce processing steps and the development period, and can achieve a size reduction. The semiconductor device includes an input/output pad 101, a power supply voltage node VDE to which a power supply voltage is supplied, a reference potential node GND to which a reference potential is supplied, a first diode 131 whose anode is connected to the input/output pad 101 and whose cathode is connected to a first node BP, a potential control circuit 103 that is connected to the input/output pad 101 and the power supply voltage node VDE and is configured to, when a voltage lower than the power supply voltage is input into the input/output pad 101, perform control such that the first node BP has a voltage equal to the power supply voltage, a trigger circuit 109 that outputs a static electricity-on signal upon input of static electricity into the input/output pad 101, and an electrostatic discharge surge pass circuit 108 that, upon output of the static electricity-on signal, causes an electrostatic discharge current to flow between the first node BP and the reference potential node GND.

In the semiconductor device disclosed in Japanese Patent No. 5082841, a back gate of a P channel MOS field effect transistor 121 of an output buffer 110 is connected to the first node BP of an ESD protection circuit 106, and not to the power supply voltage node VDE. Accordingly, even when a voltage higher than the power supply voltage is applied to the input/output pad 101, current does not flow from the input/output pad 101 to the power supply voltage node VDE, and voltage is applied from the input/output pad 101 to the back gate of the transistor 121 via the first diode 131 or a P channel MOS field effect transistor 112. However, in the case where a plurality of input/output pads are provided in the semiconductor device, in order to separate the potentials of the back gates of the P channel MOS field effect transistors connected to the input/output pads, it is necessary to provide an ESD protection circuit for each input/output pad.

JP-A-H10-214940 (paragraphs 0011-0012, FIG. 1) discloses a semiconductor device designed to increase electrostatic destruction tolerance between a power supply terminal and a ground terminal without increasing the chip area or increasing the complexity of the layout design of an internal circuit. The semiconductor device includes a plurality of metal terminals provided on a semiconductor substrate, a first common discharge line connected commonly to each of at least some of the plurality of metal terminals, a second common discharge line connected commonly to each of at least some of the metal terminals, first electrostatic protection elements that are provided so as to correspond to at least some of power supply terminals and ground terminals out of the plurality of metal terminals and connects each of the power supply terminal and the ground terminal to the first common discharge line so as to protect the internal circuit from electrostatic destruction, and second electrostatic protection elements that are provided so as to correspond to at least some of power supply terminals and ground terminals out of the metal terminals and connects each of the power supply terminal and the ground terminal to the second common discharge line so as to protect the internal circuit from electrostatic destruction.

Furthermore, JP-A-2010-80472 (paragraphs 0017-0018, FIG. 1) discloses a semiconductor device including a plurality of circuit blocks having separated power supply systems, wherein the resistance against static electricity is improved. The semiconductor device includes a plurality of circuit blocks having separated power supply systems, a first group of diodes having anodes connected respectively to ground potential lines of the plurality of circuit blocks, a second group of diodes having cathodes connected respectively to the ground potential lines of the plurality of circuit blocks, and a floating common discharge line connected to the cathodes of the first group of diodes and the anodes of the second group of diodes.

JP-A-H10-214940 and JP-A-2010-80472 disclose one or more common discharge lines, but do not propose protective measures against electrostatic discharge for a signal terminal in a semiconductor integrated circuit device internally provided with an output buffer circuit having a tolerant function.

In a semiconductor integrated circuit device internally provided with an output buffer circuit having a tolerant function, it is not possible to connect a protective diode between a signal terminal and a high potential-side power supply terminal, and it is therefore necessary to take special protective measures against electrostatic discharge for the signal terminal. Accordingly, in view of the above, a first object of the invention is to, in a semiconductor integrated circuit device internally provided with an output buffer circuit having a tolerant function, eliminate the need for a large protection diode that can withstand heat generation caused by a surge current generated at the time of breakdown, and suppress the increase in the area of the semiconductor substrate and the increase in the cost of the semiconductor integrated circuit device by causing only a forward current to flow through a protective diode. A second object of the invention is to, even when a plurality of output buffer circuits connected respectively to a plurality of signal terminals are provided, protect the internal circuit from electrostatic discharge without causing interference between the plurality of output buffer circuits, with a simple circuit configuration.

SUMMARY

An advantage of some aspects of the invention is to provide a semiconductor integrated circuit device including: a first power supply terminal to which a high potential-side power supply potential is supplied; a second power supply terminal to which a low potential-side power supply potential is supplied; a signal terminal used to output at least a signal; an output buffer circuit including a P channel transistor connected between the first power supply terminal and the signal terminal, and an N channel transistor connected between the signal terminal and the second power supply terminal; a potential control circuit that supplies potential from the first power supply terminal or the signal terminal to a back gate of the P channel transistor according to the potential of the signal terminal; a first protection diode having an anode connected to the signal terminal; a common discharge line connected to a cathode of the first protection diode; an electrostatic discharge protection circuit connected between the common discharge line and the second power supply terminal; and a second protection diode having an anode connected to the second power supply terminal, and a cathode connected to the signal terminal.

According to this aspect of the invention, positive charges applied to the signal terminal due to electrostatic discharge are discharged to the second power supply terminal via the first protection diode, the common discharge line and the electrostatic discharge protection circuit, and negative charges applied to the signal terminal due to electrostatic discharge are discharged to the second power supply terminal via the second protection diode, and it is therefore possible to cause only a forward current to flow through the protection diode. Accordingly, the need for a large protection diode that can withstand heat generation caused by a surge current generated at the time of breakdown can be eliminated, and the increase in the area of the semiconductor substrate and the increase in the cost of the semiconductor integrated circuit device can be suppressed.

Also, the back gate of the P channel transistor of the output buffer circuit is separated from the common discharge line, and thus even in a configuration in which a plurality of output buffer circuits respectively connected to a plurality of signal terminals are provided, it is possible to protect the internal circuit from electrostatic discharge without causing interference between the plurality of output buffer circuits by using a single electrostatic discharge protection circuit.

The semiconductor integrated circuit device may further include a diode that has an anode connected to the first power supply terminal and a cathode connected to the common discharge line, and is configured to provide potential to the common discharge line based on the high potential-side power supply potential. In this case, the potential of the common discharge line is fixed to a potential lower than the high potential-side power supply potential by an amount corresponding to the forward voltage of the diode during normal operation, and it is therefore possible to prevent current from flowing from the signal terminal to the common discharge line via the first protection diode.

Also, it is desirable that a trigger voltage of the electrostatic discharge protection circuit when a potential higher than the lower potential-side power supply potential is applied to the common discharge line is smaller than a reverse breakdown voltage of the second protection diode. In this case, if positive charges are applied to the signal terminal due to electrostatic discharge, the positive charges can be discharged to the second power supply terminal without causing breakdown of the second protection diode by using the electrostatic discharge protection circuit.

Furthermore, the electrostatic discharge protection circuit may include: a thyristor having an anode connected to the common discharge line and a cathode connected to the second power supply terminal; and a diode having an anode connected to the second power supply terminal and a cathode connected to the common discharge line. The thyristor conducts electricity when the potential difference between the common discharge line and the second power supply terminal reaches the trigger voltage or more, and thus if positive charges are applied to the signal terminal due to electrostatic discharge, and the potential of the common discharge line increases, the thyristor discharges the positive charges to the second power supply terminal so as to bring the potential of the common discharge line closer to the potential of the second power supply terminal. Also, when positive charges are applied to the second power supply terminal due to electrostatic discharge, the positive charges are discharged to the common discharge line via the diode, and thus the potential difference between the common discharge line and the second power supply terminal decreases. It is thereby possible to prevent destruction of the internal circuit of the semiconductor integrated circuit device.

An electronic appliance according to one aspect of the invention includes the semiconductor integrated circuit device according to any one of the above-described aspects of the invention. It is thereby possible to, during manufacturing process of various types of electronic appliances, protect the internal circuit of the semiconductor integrated circuit device internally provided with an output buffer circuit having a tolerant function from electrostatic discharge.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described in detail with reference to the drawings.

Figure 1:
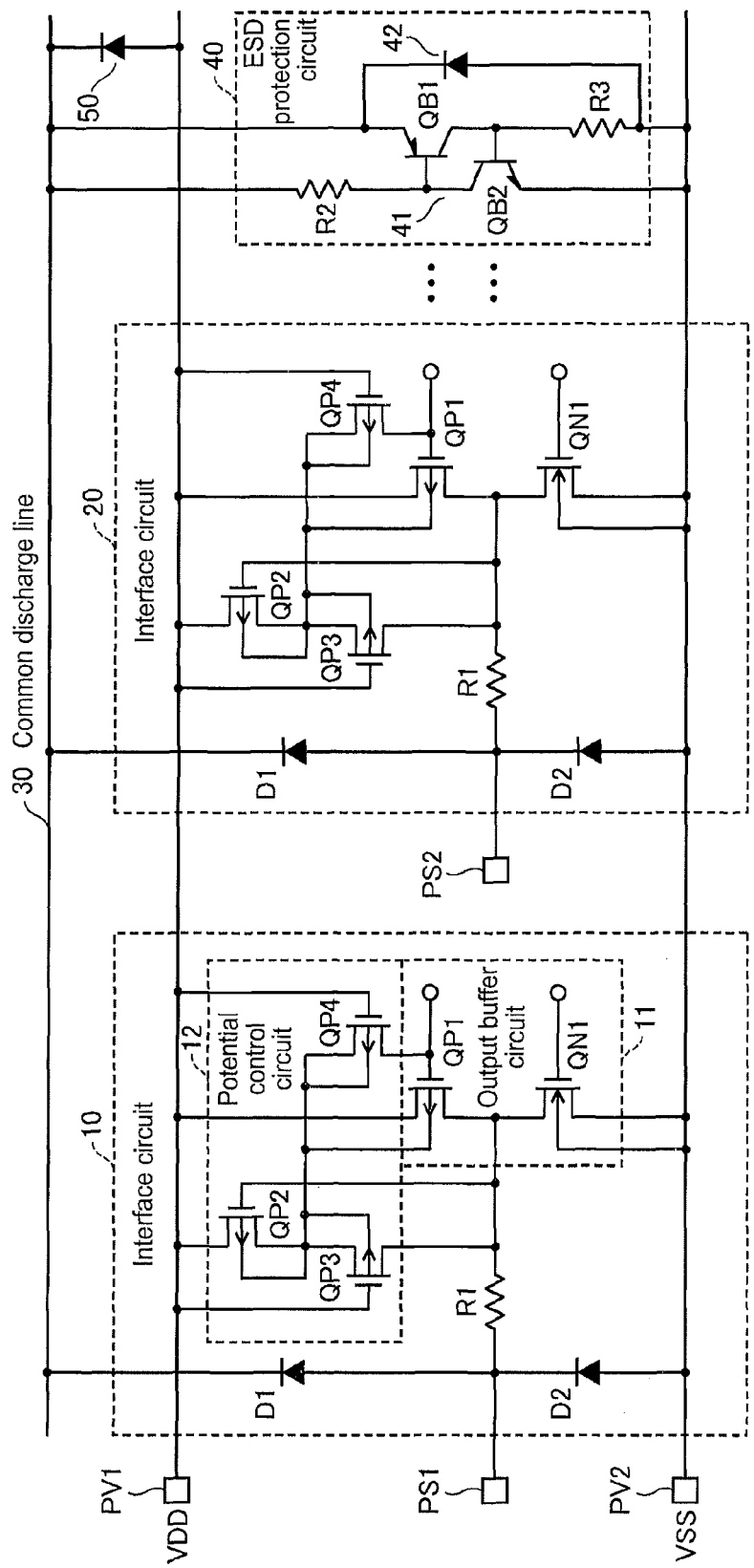
FIG. 1 is a circuit diagram showing an example of a configuration of a semiconductor integrated circuit device according to an embodiment of the invention.

FIG. 1 is a circuit diagram showing an example of a configuration of a semiconductor integrated circuit device according to an embodiment of the invention. The semiconductor integrated circuit device includes a power supply terminal (pad) PV1 to which a high potential-side power supply potential VDD is supplied, a power supply terminal (pad) PV2 to which a low potential-side power supply potential VSS that is lower than VDD is supplied, at least one signal terminal (pad), at least one interface circuit, a common discharge line 30, and an electrostatic discharge (ESD) protection circuit 40. The semiconductor integrated circuit device may further include a diode 50.

FIG. 1 shows, as an example, a plurality of signal terminals PS1 and PS2, and a plurality of interface circuits 10 and 20. The signal terminals PS1 and PS2 may be used to input and output signals, or may be used to output signals. Accordingly, the interface circuits 10 and 20 connected respectively to the signal terminals PS1 and PS2 may each include an input circuit and an output circuit, or may each include only an output circuit. FIG. 1 shows, as an example, the interface circuits 10 and 20 that each include only an output circuit. The interface circuit 20 has the same configuration as the interface circuit 10, and thus the configuration of the interface circuit 10 will be described below.

The interface circuit 10 includes an output buffer circuit 11, a potential control circuit 12, and protection diodes D1 and D2. The interface circuit 10 may further include a protective resistor R1 having a small resistance value. The output buffer circuit 11 includes a P channel MOS field effect transistor QP1 connected between the power supply terminal PV1 and the signal terminal PS1, and an N channel MOS field effect transistor QN1 connected between the signal terminal PS1 and the power supply terminal PV2.

The transistor QP1 includes a source connected to the power supply terminal PV1 and a drain connected to the signal terminal PS1 via the resistor R1. The transistor QN1 includes a drain connected to the signal terminal PS1 via the resistor R1, and a source connected to the power supply terminal PV2. The output buffer circuit 11 reverses the level of the signal applied to gates of the transistors QP1 and QN1, and supplies an output signal having the reversed level to the signal terminal PS1 via the resistor R1.

The drain and back gate of the transistor QP1 form a PN junction (parasitic diode). With an ordinary output buffer circuit, the back gate of the transistor QP1 is connected to the power supply terminal PV1. Accordingly, if a potential higher than the power supply potential VDD by an amount that is greater than or equal to the forward voltage of the parasitic diode is applied to the signal terminal PS1, current flows from the signal terminal PS1 to the power supply terminal PV1 via the parasitic diode.

In order to prevent this, in the present embodiment, the back gate of the transistor QP1 is formed by a floating N-well, and the output buffer circuit 11 has a tolerant function. The potential control circuit 12 includes P channel MOS field effect transistors QP2 to QP4, and supplies potential from the power supply terminal PV1 or the signal terminal PS1 to the back gate (floating N-well) of the transistor QP1 according to the potential of the signal terminal PS1.

The transistor QP2 includes a source connected to the power supply terminal PV1, a drain connected to the back gate of the transistor QP1, and a gate connected to the signal terminal PS1 via the resistor R1. The transistor QP3 includes a source connected to the signal terminal PS1 via the resistor R1, a drain connected to the back gate of the transistor QP1, and a gate connected to the power supply terminal PV1. The transistor QP4 includes a source connected to the back gate of the transistor QP1, a drain connected to the gate of the transistor QP1, and a gate connected to the power supply terminal PV1. For example, by forming the back gates of the transistors QP1 to QP4 by using the same floating N-well, the back gates of the transistors QP1 to QP4 have the same potential.

Figure 2:
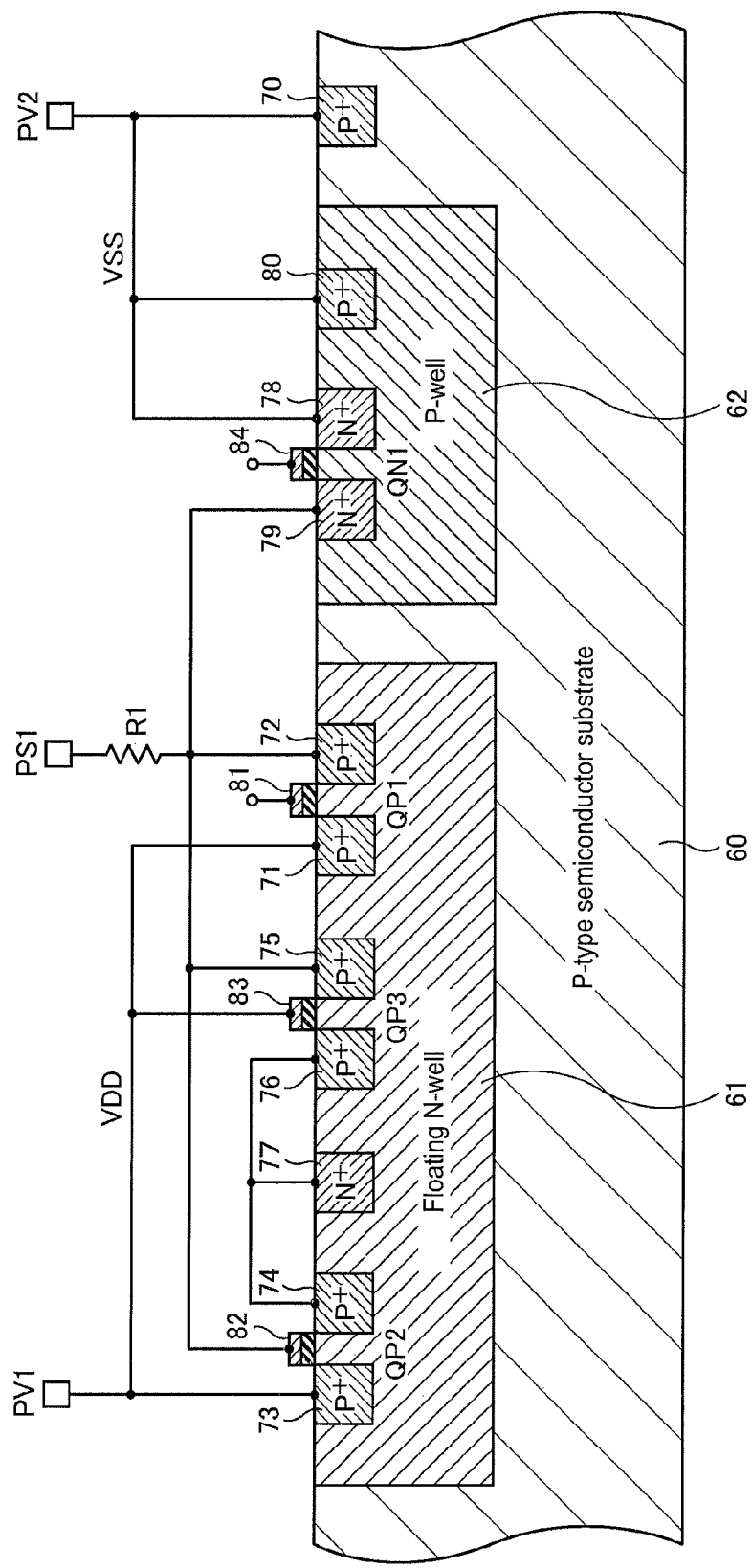
FIG. 2 is a cross-sectional view showing a cross section of a semiconductor substrate on which transistors of interface circuits are formed.

FIG. 2 is a cross-sectional view showing a cross section of a semiconductor substrate on which transistors of interface circuits are formed. As shown in FIG. 2, in a P-type semiconductor substrate 60, a floating N-well 61, a P-well 62, and a P-type impurity diffusion region 70 are formed. In the floating N-well 61, the transistors QP1 to QP4 shown in FIG. 1 are formed (the transistor QP4 is not shown). In the P-well 62, the transistor QN1 shown in FIG. 1 is formed. The P-type impurity diffusion region 70 is electrically connected to the semiconductor substrate 60, and is provided to supply a power supply potential VSS to the semiconductor substrate 60.

In the floating N-well 61, P-type impurity diffusion regions 71 to 76, and an N-type impurity diffusion region 77 are formed. The P-type impurity diffusion regions 71 and 72 respectively constitute a source and a drain of the transistor QP1. The P-type impurity diffusion regions 73 and 74 respectively constitute the source and the drain of the transistor QP2. The P-type impurity diffusion regions 75 and 76 respectively constitute the source and the drain of the transistor QP3. The floating N-well 61 constitutes the back gates of the transistors QP1 to QP3. The N-type impurity diffusion region 77 is electrically connected to the floating N-well 61, and is provided to supply a desired potential from the transistor QP2 or QP3 to the floating N-well 61. Also, on a primary surface of the semiconductor substrate 60, gate electrodes 81 to 83 of the transistors QP1 to QP3 are provided via a gate insulating film.

In the P-well 62, N-type impurity diffusion regions 78 and 79, and a P-type impurity diffusion region 80 are formed. The N-type impurity diffusion regions 78 and 79 respectively constitute the source and the drain of the transistor QN1. The P-well 62 constitutes the back gate of the transistor QN1. The P-type impurity diffusion region 80 is electrically connected to the P-well 62, and is provided to supply the power supply potential VSS to the P-well 62. In addition, on the primary surface of the semiconductor substrate 60, a gate electrode 84 of the transistor QN1 is provided via the gate insulating film.

Referring back to FIG. 1, the operations of the transistors QP1 to QP4 will be described. In the following, as examples, two cases will be described where no potential is applied from an external circuit to the signal terminal PS1, and where a potential of 5 V is applied from an external circuit to the signal terminal PS1, assuming that the power supply potential VDD supplied to the power supply terminal PV1 is 3.3 V, and the power supply potential VSS supplied to the power supply terminal PV2 is a ground potential (0 V).

In the case where no potential is applied from an external circuit to the signal terminal PS1, when the output signal of the output buffer circuit 11 has a low level (0V), the transistor QP2 is turned on to supply a power supply potential VDD of 3.3 V from the power supply terminal PV1 to the back gate of the transistor QP1. The transistors QP3 and QP4 are turned off. In this way, the back gate of the transistor QP1 is maintained at a power supply potential VDD of 3.3 V, and thus the transistor QP1 can operate normally.

On the other hand, in the case where a potential of 5 V is applied from an external circuit to the signal terminal PS1, the transistor QP3 is turned on to supply a potential of 5 V from the signal terminal PS1 to the back gate of the transistor QP1 via the resistor R1. The transistor QP2 is turned off. The transistor QP4 is turned on to supply a potential of 5 V from the back gate of the transistors QP1 to the gate of the transistor QP1.

In this way, the back gate and the gate of the transistor QP1 are maintained at a potential of 5 V, and it is thereby possible to prevent current from flowing from the signal terminal PS1 to the power supply terminal PV1. At this time, the potential control circuit 12 may stop the operation of a circuit of a preceding stage driving the gate of the transistor QP1 so as to increase the output impedance of the circuit of the preceding stage.

Also, in the interface circuit 10, the protection diodes D1 and D2 are provided in order to protect the internal circuit from charges applied to the signal terminal PS1 due to electrostatic discharge. The protection diode D1 includes an anode connected to the signal terminal PS1 and a cathode connected to the common discharge line 30. Likewise, the protection diode D2 includes an anode connected to the power supply terminal PV2 and a cathode connected to the signal terminal PS1.

Here, if the cathode of the protection diode D1 is connected to the power supply terminal PV1, it is not possible to implement the tolerant function of the interface circuit 10. If the cathode of the protection diode D1 is connected to the back gate (floating N-well) of the transistor QP1, in order to prevent interference between a plurality of output buffer circuits, it is necessary to provide an ESD protection circuit for each interface circuit.

Accordingly, in the present embodiment, the common discharge line 30 connected to the cathodes of the protection diodes Di of the plurality of interface circuits 10 and 20 is provided. In addition, an ESD protection circuit 40 is connected between the common discharge line 30 and the power supply terminal PV2. With this configuration, the plurality of interface circuits 10 and 20 can be protected from electrostatic discharge by using the single ESD protection circuit 40. Furthermore, it is also possible to provide another ESD protection circuit 40 between the power supply terminal PV1 and the power supply terminal PV2.

In order to provide an appropriate potential to the common discharge line 30, a diode 50 may be provided. The diode 50 includes an anode connected to the power supply terminal PV1 and a cathode connected to the common discharge line 30, and provides potential to the common discharge line 30 based on the power supply potential VDD. By doing so, during normal operation, the potential of the common discharge line 30 is fixed to a potential lower than the power supply potential VDD by an amount corresponding to the forward voltage of the diode 50, and it is therefore possible to prevent current from flowing from the signal terminals PS1 and PS2 to the common discharge line 30 via the protection diode D1.

For example, the ESD protection circuit 40 may include a reverse conducting thyristor (RCT) constituted by a thyristor 41 and a diode 42. An equivalent circuit of the thyristor 41 is a combination of a PNP bipolar transistor QB1 and an NPN bipolar transistor QB2. An emitter of the transistor QB1 corresponds to an anode of the thyristor 41, an emitter of the transistor QB2 corresponds to a cathode of the thyristor 41, and a base of the transistor QB2 corresponds to a gate of the thyristor 41.

The anode of the thyristor 41 is connected to the common discharge line 30, and the cathode of the thyristor 41 is connected to the power supply terminal PV2. A resistor R2 is connected between the common discharge line 30 and a base of the transistor QB1, and a resistor R3 is connected between the base of the transistor QB2 and the power supply terminal PV2.

The thyristor 41 conducts electricity when the potential difference between the common discharge line 30 and the power supply terminal PV2 reaches a trigger voltage or more. Accordingly, if positive charges are applied to the signal terminal PS1 or PS2 due to electrostatic discharge, and the potential of the common discharge line 30 increases, the thyristor 41 discharges the positive charges to the power supply terminal PV2 so as to bring the potential of the common discharge line 30 closer to the potential of the power supply terminal PV2. Besides the thyristor 41, it is also possible to use a clamping element that conducts electricity when the potential difference between the common discharge line 30 and the power supply terminal PV2 reaches the trigger voltage or more.

The diode 42 includes an anode connected to the power supply terminal PV2 and a cathode connected to the common discharge line 30. Upon application of positive charges to the power supply terminal PV2 due to electrostatic discharge, the positive charges are discharged to the common discharge line 30 via the diode 42, and thus the potential difference between the common discharge line 30 and the power supply terminal PV2 decreases. It is thereby possible to prevent destruction of the internal circuit of the semiconductor integrated circuit device.

In the semiconductor integrated circuit device configured as described above, if positive charges are applied to the signal terminal PS1 due to electrostatic discharge, the positive charges are discharged to the power supply terminal PV2 via the protection diode D1, the common discharge line 30 and the ESD protection circuit 40. If, on the other hand, negative charges are applied to the signal terminal PS1 due to electrostatic discharge, the negative charges are discharged to the power supply terminal PV2 via the protection diode D2.

As described above, according to the present embodiment, it is possible to cause only a forward current to flow through the protection diodes D1 and D2. Accordingly, the need for a large protection diode that can withstand heat generation caused by a surge current generated at the time of breakdown can be eliminated, and the increase in the area of the semiconductor substrate and the increase in the cost of the semiconductor integrated circuit device can be suppressed.

Also, because the back gate of the transistor QP1 of the output buffer circuit 11 is separated from the common discharge line 30, even in the configuration in which the plurality of output buffer circuits respectively connected to the plurality of signal terminals PS1 and PS2 are provided, it is possible to protect the internal circuit from static electricity without causing interference between the plurality of output buffer circuits with the use of the single electrostatic discharge protection circuit 40.

It is desirable that the trigger voltage of the ESD protection circuit 40 when a potential higher than the power supply potential VSS is applied to the common discharge line 30 is set to be smaller than a reverse breakdown voltage of the protection diode D2. By doing so, it is possible to, if positive charges are applied to the signal terminal PS1 or PS2 due to electrostatic discharge, discharge the positive charges to the power supply terminal PV2 without causing breakdown of the protection diode D2 by using the ESD protection circuit 40.

The semiconductor integrated circuit device of the present embodiment can be used in various types of electronic appliances. In particular, an electronic appliance that uses a display device including a liquid crystal panel and a liquid crystal driver that drives the liquid crystal panel, a microcomputer including a central processing unit (CPU) and a memory, and the like is provided with a plurality of semiconductor integrated circuit devices that operate at different power supply voltages. Accordingly, the semiconductor integrated circuit device of the present embodiment can be used effectively in such an electronic appliance. It is thereby possible to protect the internal circuit of the semiconductor integrated circuit device internally provided with an output buffer circuit having a tolerant function from electrostatic discharge during manufacturing process of various types of electronic appliances.

The invention is not limited to the embodiment described above, and those skilled in the art can make various modifications within the technical concept of the invention.

What is claimed is:

1. A semiconductor integrated circuit device comprising:
   a first power supply terminal to which a first power supply potential is supplied;
   a second power supply terminal to which a second power supply potential that is lower than the first power supply potential is supplied;
   a signal terminal that at least outputs a signal;
   an output buffer circuit including a P channel transistor connected between the first power supply terminal and the signal terminal, and an N channel transistor connected between the signal terminal and the second power supply terminal;
   a potential control circuit that supplies the potential of the first power supply terminal or a potential of the signal terminal to a back gate of the P channel transistor according to the potential of the signal terminal;
   a first protection diode including an anode connected to the signal terminal;
   a common discharge line connected to a cathode of the first protection diode;
   an electrostatic discharge protection circuit connected between the common discharge line and the second power supply terminal; and
   a second protection diode including an anode connected to the second power supply terminal, and a cathode connected to the signal terminal.

2. The semiconductor integrated circuit device according to claim 1, further comprising a diode that includes an anode connected to the first power supply terminal and a cathode connected to the common discharge line, and is configured to provide potential to the common discharge line based on the first power supply potential.

3. The semiconductor integrated circuit device according to claim 1, wherein a trigger voltage of the electrostatic discharge protection circuit when a potential higher than the second power supply potential is applied to the common discharge line is smaller than a reverse breakdown voltage of the second protection diode.

4. The semiconductor integrated circuit device according to claim 1, wherein the electrostatic discharge protection circuit comprises:
   a thyristor including an anode connected to the common discharge line and a cathode connected to the second power supply terminal; and
   a diode including an anode connected to the second power supply terminal and a cathode connected to the common discharge line.

5. An electronic appliance comprising the semiconductor integrated circuit device according to claim 1.

6. A semiconductor integrated circuit device comprising;
   a first power supply terminal supplied with a first power supply potential;
   a second power supply terminal supplied with a second power supply potential, the second power supply potential being lower than the first power supply potential;
   a signal terminal that has a potential and at least outputs a signal;
   an output buffer circuit including a P channel transistor connected between the first power supply terminal and the signal terminal, and an N channel transistor connected between the signal terminal and the second power supply terminal, the P channel transistor having a back gate;
   a potential control circuit that controls, based on the potential of the signal terminal, whether to supply the potential of the first power supply terminal or to supply the potential of the signal terminal to the back gate of the P channel transistor;
   a common discharge line;
   a first protection diode including an anode connected to the signal terminal, and a cathode connected to the common discharge line;
   an electrostatic discharge protection circuit connected between the common discharge line and the second power supply terminal; and
   a second protection diode including an anode connected to the second power supply terminal, and a cathode connected to the signal terminal.

\* \* \* \* \*